(12) United States Patent
Maekawa et al.

(10) Patent No.: US 9,780,277 B2
(45) Date of Patent: Oct. 3, 2017

(54) THERMOELECTRIC DEVICE

(71) Applicant: TDK CORPORATION, Tokyo (JP)

(72) Inventors: Kazuya Maekawa, Tokyo (JP);
Takashi Asatani, Tokyo (JP)

(73) Assignee: TDK CORPORATION, Tokyo (JP)

( * ) Notice: Subject to any disclaimer, the term of this patent is extended or adjusted under 35 U.S.C. 154(b) by 229 days.

(21) Appl. No.: 14/638,690

(22) Filed: Mar. 4, 2015

(65) Prior Publication Data
US 2015/0255698 A1  Sep. 10, 2015

(30) Foreign Application Priority Data

Mar. 5, 2014  (JP) ................. 2014-042349
Jan. 21, 2015  (JP) ................. 2015-009346

(51) Int. Cl.
*H01L 35/32* (2006.01)
*H01L 35/26* (2006.01)
*H01L 35/22* (2006.01)

(52) U.S. Cl.
CPC ............. *H01L 35/26* (2013.01); *H01L 35/22* (2013.01)

(58) Field of Classification Search
CPC ....... H01L 35/325; H01L 35/26; H01L 35/22; H01L 35/32

USPC ......................................................... 136/200
See application file for complete search history.

(56) References Cited

U.S. PATENT DOCUMENTS

| 5,550,387 A * | 8/1996 | Elsner ..................... H01L 35/22 136/203 |
| 6,060,656 A * | 5/2000 | Dresselhaus ............ H01L 35/26 136/203 |

FOREIGN PATENT DOCUMENTS

JP          2000244023 A       9/2000

* cited by examiner

*Primary Examiner* — Jayne Mershon
(74) *Attorney, Agent, or Firm* — Oliff PLC (57) ABSTRACT

A thermoelectric device includes a semiconductor stacked thermoelectric thin film including a first high-purity layer composed of SiGe as a main material and a composite carrier supply layer formed on the first high-purity layer. The composite carrier supply layer includes a second high-purity layer and third high-purity layer composed of Si as a main material, and a carrier supply layer held between the second and third high-purity layers and composed of SiGe as a main material. The carrier supply layer is a P-type carrier supply layer to which an additive of a group XIII element is added or a N-type carrier supply layer to which an additive of a group XV element is added.

5 Claims, 7 Drawing Sheets

THERMOELECTRIC DEVICE

BACKGROUND OF THE INVENTION

1. Field of the Invention

The present invention relates to a thermoelectric device having thermoelectric properties.

2. Description of the Related Art

Thermoelectric devices utilizing thermoelectric properties of materials are investigated. Examples of a thermoelectric device using the Seebeck effect include a power-generating device utilizing a temperature difference between the outside air and human bodies, and a power-generating device utilizing waste heat from automotive cars, incinerators, heating devices, or the like. Examples of a thermoelectric devices using the Peltier effect include cooling devices for CPU and a laser medium. In particular, the power generating device utilizing a temperature difference attracts attention as an energy harvesting component.

Thermoelectric devices which have been investigated are bulk-type devices using bulk materials such as bismuth-tellurium (BiTe)-based, lead-tellurium (PbTe)-based, silicide-based, or oxide-based materials, or the like. However, the bulk-type devices have very low power factor.

Japanese Unexamined Patent Application Publication No. 2000-244023 proposes, as a thermoelectric device using a thin film, a hetero-structure thermoelectric device including a carrier supply layer t which an additive is added and which has a predetermined band gap, and a high-purity layer which has a band gap smaller than that of the carrier supply layer. Also, silicon/silicon germanium (hereinafter referred to as "Si/SiGe") is described as an example of the carrier supply layer/high-purity layer.

SUMMARY OF THE INVENTION

However, even when a hetero-structure including two layers having different band gaps, such as Si/SiGe, is realized, it is difficult to actually realize a thermoelectric device having high power factor. An object of the present invention is to realize a thermoelectric device having high power factor.

The present invention relates to a thermoelectric device including a semiconductor stacked thermoelectric thin film including a first high-purity layer composed of SiGe as a main material and a composite carrier supply layer formed on the first high-purity layer. The composite carrier supply layer includes a second high-purity layer and third high-purity layer composed of Si as a main material, and a carrier supply layer held between the second and third high-purity layers and composed of SiGe as a main material. The carrier supply layer is a P-type carrier supply layer to which an additive of a group XIII element is added or a N-type carrier supply layer to which an additive of a group XV element is added.

In the stacked structure, the addition of a specified element to the carrier supply layer can increase electric conductivity while suppressing a decrease in Seebeck coefficient, and thus power factor can be improved.

Further, the stacked thermoelectric thin film preferably has a plurality of stacked structures each having the first high-purity layer and the composite carrier supply layer. This makes it easy to obtain high electric power, for example, in application to thermoelectric power generation.

Further, at least one of the rocking-curve half widths of a 0th order peak corresponding to the average lattice constant of a superlattice of the stacked thermoelectric thin film and satellite peaks of the 0th-order peak observed by X-ray diffraction measurement is preferably 0.1° or less. The stacked structure having such crystallinity can realize higher power factor.

Further, when the stacked thermoelectric thin film has crystallinity such that third or higher-order satellite peaks of a superlattice of the stacked thermoelectric thin film are observed in X-ray diffraction measurement of the stacked thermoelectric thin film, even higher power factor can be realized.

Further, each of the first high-purity layer, the second high-purity layer, and the third high-purity layer preferably has a thickness of 1 nm or more and 50 nm or less. This can increase the electron density in each of the layers and can realize even higher power factor.

Further, the carrier supply layer preferably has a thickness equal to or larger than the thickness of a monoatomic layer and of 10 nm or less. This can increase the electron density in the carrier supply layer and can realize even higher power factor.

According to the present invention, a thermoelectric device with higher power factor can be realized.

DESCRIPTION OF THE PREFERRED EMBODIMENTS

Preferred embodiments of the present invention are described below with reference to the drawings. The present invention is not limited to the embodiments below. Also, components described below include components which can be easily conceived by the persons skilled in the art and substantially the same components as those components. Further, the components described below can be properly combined. Also, various omissions, substitutions, or changes of the components can be made without deviating from the scope of the gist of the present invention.

Figure 1:
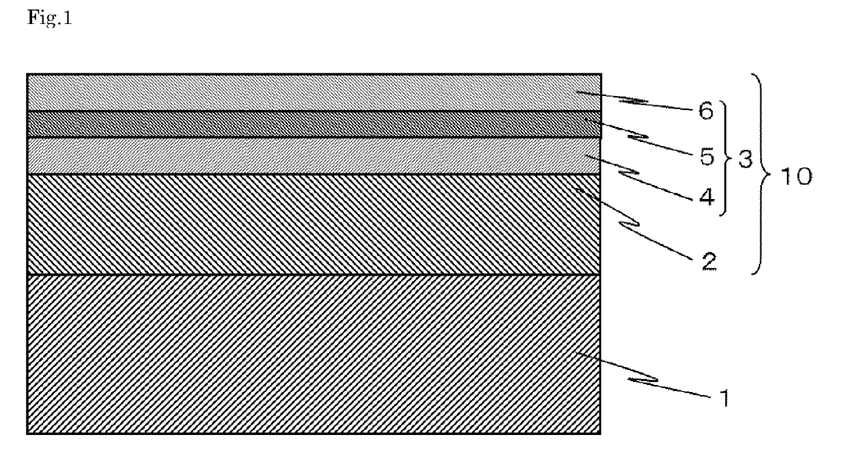
FIG. 1 is a cross-sectional view schematically showing a structure of a stacked thermoelectric thin film according to a first embodiment of the present invention.

FIG. 1 is a cross-sectional view of a stacked thermoelectric thin film 10 according to a first embodiment. A thermoelectric device 14 of the embodiment includes the semiconductor stacked thermoelectric thin film 10 having a composite carrier supply layer 3 provided on a first high-purity layer 2 composed of SiGe as a main material, and the composite carrier supply layer 3 includes second and third high-purity layers 4 and 6 composed of Si as a main material and a carrier supply layer 5 held between the second and third high-purity layers 4 and 6 and composed of SiGe as a main material. The stacked thermoelectric thin film 10 is formed on the (100) plane of a Si substrate 1.

Figure 2:
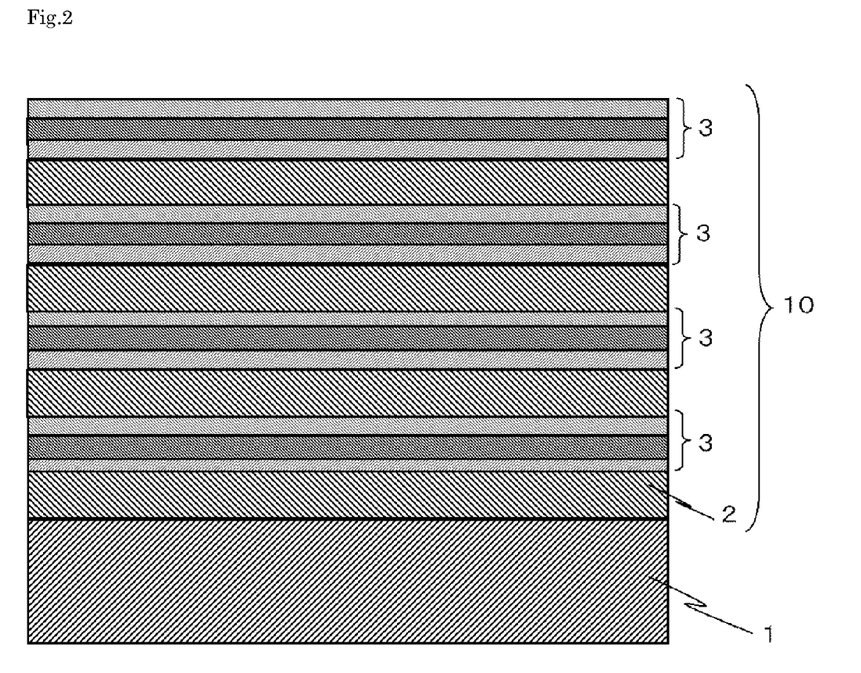
FIG. 2 is a cross-sectional view schematically showing a structure of a stacked thermoelectric thin film according to a second embodiment of the present invention.

FIG. 2 is a cross-sectional view of a stacked thermoelectric thin film 10 according to a second embodiment. The stacked thermoelectric thin film 10 according to the second embodiment includes a plurality of stacked structures each having the first high-purity layer 2 and the composite carrier supply layer 3 of the stacked thermoelectric thin film 10 according to the first embodiment. FIG. 2 shows four stacked structures in order to make it easy to see. The first high-purity layer 2 and the composite carrier supply layer 3 are preferably alternately stacked to form multiple stacked layers. The number of the layers stacked is appropriately selected according to the purpose. In particular, multiple stacked layers are preferred for application to thermoelectric power generation because not only high electromotive force but also high electric power are required for application to thermoelectric power generation, and thus electric power can be easily drawn by stacking multiple layers. In the present invention, the term "high-purity layer" represents a layer having a purity of 99.9% or more and containing a group XIII element or group XV element in an amount of less than 0.0001 atomic % relative to the main material.

In the first and second embodiments, the carrier supply layer 5 is a P-type carrier supply layer to which an additive of a group XIII element, such as B, Al, Ga, In, or Tl, is added or a N-type carrier supply layer to which an additive of a group XV element, such as N, P, As, Sb, or Bi, is added. The carrier supply layer 5 is a semiconductor layer and is imparted, by an additive, with the characteristics of a N-type semiconductor in which electrons function or a P-type semiconductor in which holes function.

In the first and second embodiments, the first high-purity layer 2, the second high-purity layer 4, the third high-purity layer 6, and the carrier supply layer 5 have a crystal structure having orientation in a specified plane orientation. The substrate 1 is a Si substrate with plane orientation (100) and functions to orient the stacked thin film constituting the stacked thermoelectric thin film 10 in a specified plane orientation. In particular, a surface of the substrate 1 on which films are deposited preferably has clear plane orientation information.

In the embodiments, the expression "with specified plane orientation" represents being an epitaxial film, and the epitaxial film is first required to be a single-orientation film. In this case, the single-orientation film is a film showing a reflection peak with the maximum intensity on an intended plane as compared with reflection peak intensities on planes other than the intended plane in X-ray diffraction measurement. For example, a (00 k) single-orientation film, that is, a c-plane singe-orientation film, shows a reflection peak with the maximum intensity on a (00 k) plane as compared with reflection peak intensities on planes other than the (00 k) plane in X-ray diffraction measurement of the film by a θθ/2θ method. In addition, (00 k) represents a general term of equivalent planes, such as (001), (002), and the like.

In the embodiments, a second condition for the epitaxial film is that when the in-plane is the x-y plane, and the thickness direction is the z-axis direction, the crystal is uniformly oriented in the z-axis direction, the y-axis direction, and the z-axis direction. Such orientation can be confirmed by a spot-like or streak-like sharp pattern in evaluation using both a transmission electron microscope and reflection high-energy electron diffraction. For example, when a deposited film having an irregular surface has disturbed crystal orientation, a reflection high-energy electron diffraction pattern tends to extend in a ring form, not has a sharp spot shape. When a film satisfies the two conditions described above, the film is considered as an epitaxial film.

Figure 3:
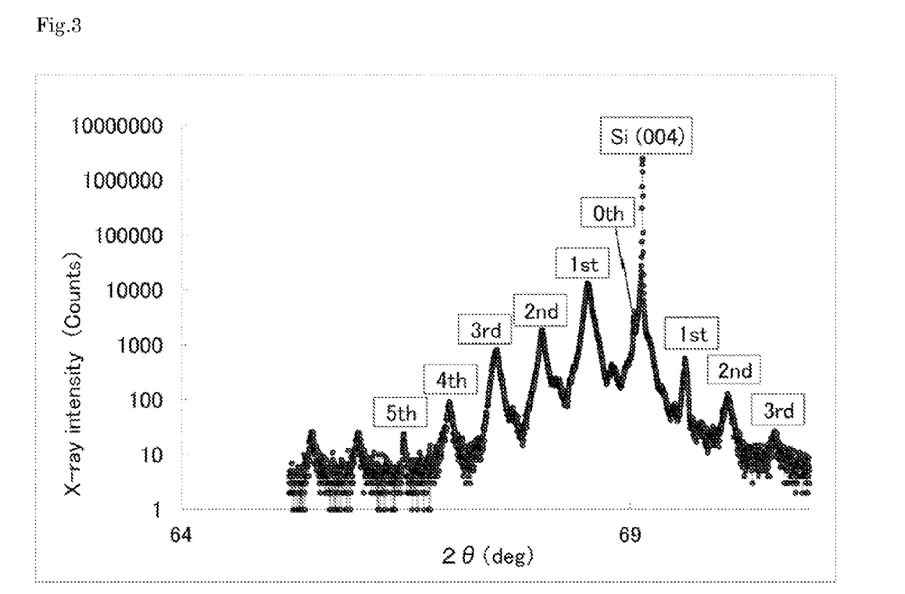
FIG. 3 is a diagram showing the results and satellite peaks observed by X-ray diffraction measurement of the stacked thermoelectric thin film according to the second embodiment of the present invention.

The stacked thermoelectric thin film 10 of the second embodiment shows satellite peaks characteristic of a stacked film having a periodic structure in X-ray diffraction measurement. When the stacked thermoelectric thin film 10 is a periodic film formed by stacking several times the stacked structure of the first high-purity layer 2 and the composite carrier supply layer 3, characteristic satellite peaks are observed by X-ray diffraction measurement. Observation of the satellite peaks can confirm orientation and plane orientation. FIG. 3 is a diagram showing the satellite peak state obtained by plotting the results of X-ray diffraction measurement of the stacked thermoelectric thin film 10 of the second embodiment by using a θ/2θ method. The θ/2θ method is a measurement method for X-ray diffraction in which an object is moved at intervals of θ and a detection side is moved at intervals of 2θ.

In FIG. 3, intensity peaks (orientation peaks) of a (004) orientation plane by X-diffraction of the Si substrate with plane orientation (100) are confirmed within a range of 69.1 to 69.2 (deg). However, satellite peaks due to interference and diffraction of a periodic film formed by stacking several times the stacked structure of the first high-purity layer 2 and the composite carrier supply layer 3 are observed around the (004) orientation peak of the Si substrate. The stacked thermoelectric thin film 10 forming a superlattice has two types of periods including the basic period of the crystal and a superlattice period longer then the basic period. Therefore, beside a peak corresponding to the basic period of the crystal, 0th-order peak corresponding to the average lattice constant of the superlattice and satellite peaks of the 0th-order peak appear in X-ray diffraction. Since the distance between the adjacent satellite peaks corresponds to the length of a reciprocal lattice with one superlattice period, information about the periodic structure can be obtained from the positions of the satellite peaks.

In the second embodiment, a 0th-order peak near the (004) orientation peak of Si and first-order, second-order, and third-order satellite peaks in order from the vicinity of the 0th-order peak are observed as satellite peaks, but third- or higher-order satellite peaks are preferably observed. In addition, when at least one of the rocking-curve half widths of the 0th-order peak and the satellite peaks observed by X-ray diffraction measurement is 0.1° or less, the epitaxial film is considered to have better crystallinity. Herein, the value of rocking-curve half width is described. The detection side is fixed at the angle of a peak detected by the θ/2θ method, and the object side is moved within a range of about ±1° to 3° of the angle θ to measure changes in the peak intensity. The rocking-curve half width is the angle width of a profile at a half of the maximum peak intensity. The smaller the half width, the more the crystal orientation is uniform.

The "power factor" is described below. A thermoelectric figure of merit Z is generally used as an index for evaluating a thermoelectric material, and Z is represented by a formula below, wherein S is a Seebeck coefficient, σ is electric conductivity, and κ is thermal conductivity.

$$Z=(S^2\sigma/\kappa)$$ (Formula 1)

In the formula 1, the product $S^2\sigma$ of the square of Seebeck coefficient S and electric conductivity σ is called "power factor". As seen from the formula 1, in order to increase the value of thermoelectric figure of merit Z, it is also important to decrease the thermal conductivity κ. The thermoelectric device 14 of the first and second embodiments has a configuration in which the composite carrier supply layer 3 including the carrier supply layer 5 which has higher electric conductivity tan Si and is held between the second and third high-purity layers 4 and 6 composed of Si with a large Seebeck coefficient as a main material is provided on the first high-purity layer 2 composed of SiGe, as a main material, with higher electric conductivity than Si. Therefore, the thermoelectric device 14 has high power factor $S^2\sigma$. Also, SiGe is an alloy and thus has lower thermal conductivity than Si, and thus the effect of increasing the thermoelectric figure of merit Z is also exhibited.

According to industrial application examples, a value of power factor of 350 ($\mu W/mK^2$) or more is preferred because it is considered to have a wider range of application as a thermoelectric device.

Each of the first high-purity layer 2 and the second and third high-purity layers 4 and 6 preferably has a thickness of 1 nm or more and 50 nm or less. The mean free path of electrons is 40 nm to 50 nm, and the thickness equal to or smaller than the mean free path of electrons can increase the electron density in these layers and can increase the Seebeck coefficient and electric conductivity, thereby achieving high power factor. A film having a thickness of less than 1 nm tends to be a discontinuous film, and the discontinuous film has a mosaic-shaped film interface, causes an influence on electron scattering, and decreases the Seebeck coefficient and electric conductivity of each of the high-purity layers. The thickness over 50 nm causes difficulty in exhibiting an effect involving the mean free path of electrons, thereby decreasing the Seebeck coefficient and electric conductivity.

The thickness of the carrier supply layer 5 is preferably equal to or larger than the monoatomic layer thickness and 10 nm or less. The thickness of 10 nm or less can improve the electron density in the carrier supply layer 5 and increase the Seebeck coefficient and electric conductivity, thereby achieving high power factor. It is considered that when the electron density is improved, the thermal conductivity is also improved. The mean free path of phonons is 10 nm, and thus the thickness equal to or smaller than the mean free path of phonons can also suppress the thermal conductivity because of the lower thermal conduction due to phonon lattice vibration. In addition, even when the carrier supply layer 5 is not a completely continuous film, it is possible to improve the electron density at the interface with each of the second and third high-purity layers and increase the Seebeck coefficient and electric conductivity as long as the interface is present between the carrier supply layer 5 and each of the second and third high-purity layers. Also, the thickness is preferably equal to or larger than the monoatomic layer thickness because the effect of suppressing the phonon thermal conduction phenomenon can be obtained.

With respect to an additive to the carrier supply layer 5, the electric conductivity can be easily increased by increasing the amount of additive added to the carrier supply layer 5, but the Seebeck coefficient tends to be decreased. The amount of the additive is preferably within a range of 0.0001 to 0.1 atomic % relative to SiGe as the main material of the carrier supply layer 5. This range can maintain the power factor value high.

The stacked thermoelectric thin film 10 is formed by depositing repeatedly 10 to 1000 times the stacked structure of the first high-purity layer 2 and the composite carrier supply layer 3. The number of the structures stacked can be properly selected according to the purpose. For example, in application to thermoelectric power generation, the number of stacked structures is preferably 100 or more. The application to thermoelectric power generation requires not only high electromotive force but also high electric power, and thus electric power can be easily drawn by stacking 100 or more of the structures.

The thermoelectric device 14 of this embodiment has higher power factor $S^2\sigma$ than usual thermoelectric devices. Therefore, the thermoelectric device 14 capable of producing high output with a small number of elements joined can be produced, thereby permitting miniaturization of an apparatus and modularization.

Figure 4:
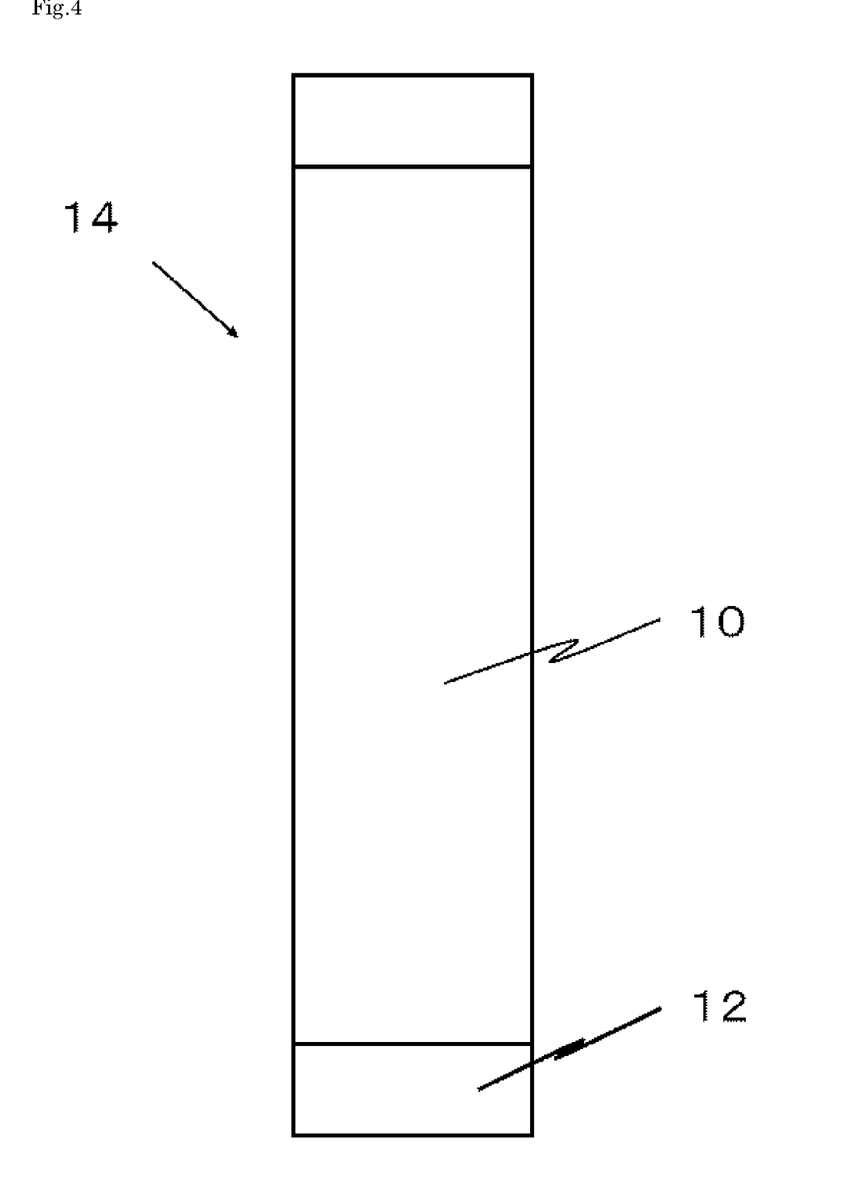
FIG. 4 is a top view schematically showing a thermoelectric device according to the first and second embodiments of the present invention.
Figure 5:
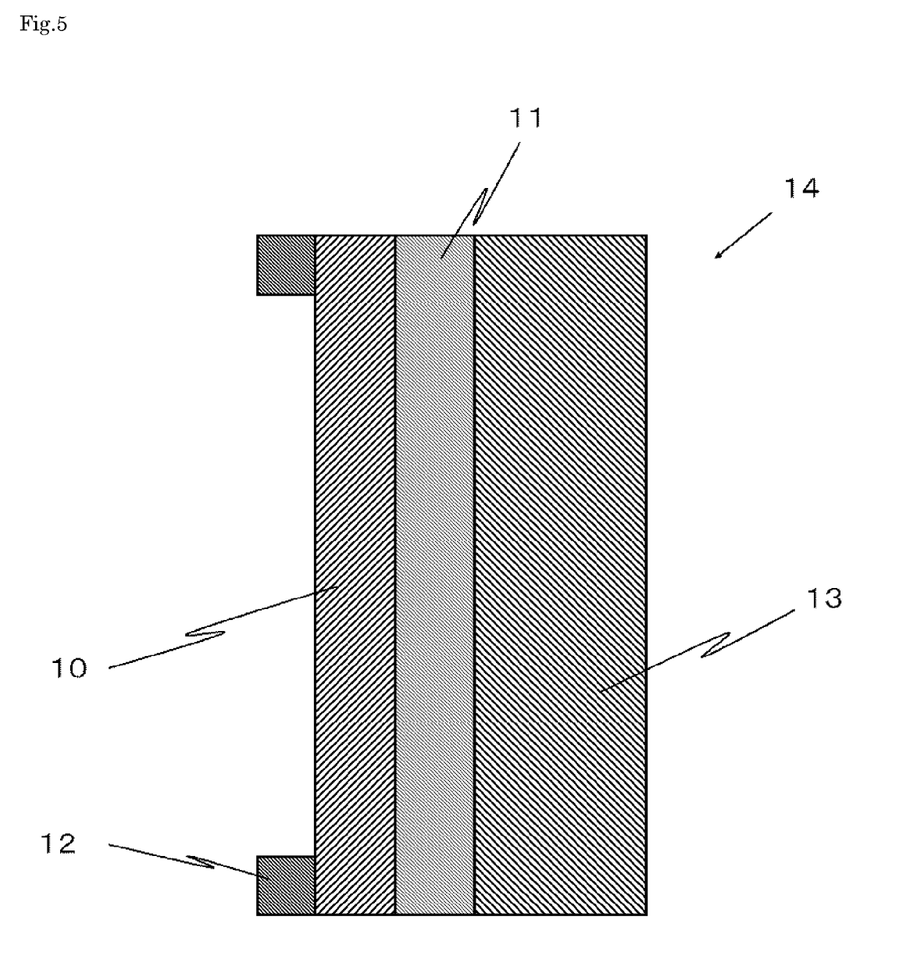
FIG. 5 is a cross-sectional view schematically showing the thermoelectric device according to the first and second embodiments of the present invention.

FIG. 4 is a top view of the thermoelectric device 14 with a rectangular parallelepiped shape provided with the stacked thermoelectric thin film 10, and FIG. 5 is a cross-sectional view of the thermoelectric device 14. The thermoelectric device 14 includes conductive terminals 12 provided at both ends of a surface of the stacked thermoelectric thin film 10, the substrate 1 being removed from the surface. Also, a protective material 13 is provided on the stacked thermoelectric thin film 10 through an adhesive layer 11. Therefore, the stacked thermoelectric thin film 10 can maintain strength and conductivity, and thus high rigidity as the thermoelectric device 14 can be obtained, that is, reliability can be achieved.

(Manufacturing Method)

A method for manufacturing the thermoelectric device 14 according to the embodiment is described below. A method for producing the first high-purity layer 2 and the composite carrier layer supply layer 3 is not particularly limited, and various film forming methods can be properly used. Examples of a physical vapor deposition method which can be used include resistance-heating vapor deposition, electron beam vapor deposition, molecular beam epitaxy, ion plating, ion beam deposition, sputtering, and the like. Examples of a chemical vapor deposition method (hereinafter referred to as "CVD") which can be used include thermal CVD, optical CVD, plasma CVD, epitaxial CVD, atomic layer CVD, MO (metal organic)-CVD, and the like.

The substrate 1 is preferably previously subjected to surface treatment before film deposition. The substrate 1 is surface-treated by, for example, washing at a high temperature with a concentrated liquid prepared by adding an alkali or acid to a hydrogen peroxide base and then washing with hydrofluoric acid.

The washed substrate 1 is subjected to film deposition. The temperature of the substrate is adjusted for epitaxially growing the stacked thermoelectric thin film 10 on the substrate 1.

Under the above-described temperature condition, the first high-purity layers 2 and the composite carrier supply layers 3 are properly alternately deposited in a necessary number of layers. In this case, the deposition rate of each of the materials is measured in advance, and the layers are alternately deposited by a time management method.

When the stacked thermoelectric thin film 10 is epitaxially grown, the thin film 10 is formed with a certain orientation relation on the substrate 1 used. Therefore, the film formation orientation of the stacked thermoelectric thin film 10 from the substrate 1 can be confirmed by a transmission electron microscope. Also, when the stacked thermoelectric thin film 10 is a periodic film formed by stacking several times the stacked structure of the first high-purity layer 2 and the composite carrier supply layer 3, characteristic satellite peaks are observed in X-ray diffraction measurement.

As shown in FIG. 5, the protective material 13 is provided, through the adhesive layer 11, on the stacked thermoelectric thin film 10 deposited as described above. In this stage, a configuration including the substrate 1, the stacked thermoelectric thin film 10, the adhesive layer 11, and the protective material 13 is formed. Examples of the protective material 13 which can be used include ceramics such as alumina, silica, zirconia, and magnesia; materials with relatively high resistance, such as quartz glass, borosilicate glass, germanium glass, sapphire glass, crystalline glass, low-expansion glass, soda glass, heat-resistant glass, high-resistance Si and the like. The material is appropriately selected according to compatibility with the stacked thermoelectric thin film 10 and the temperature of the actual device used. The adhesive material used for the adhesive layer 11 is, for example, an epoxy material.

A method for forming the protective material 13 can be properly selected from various methods such as anodic bonding, room-temperature bonding, ultrasonic bonding, and the like. The method can be properly selected so that satisfactory adhesive strength to the material of the stacked thermoelectric thin film 10 can be obtained. When a method for bonding without using an adhesive material is selected, the adhesive layer 11 is not required.

Next, the substrate 1 is removed from the structure including the substrate 1, the stacked thermoelectric thin film 10, the adhesive layer 11, and the protective material 13. A chemical removal method or mechanical removal method can be properly used as a method for removing the substrate 1. In this embodiment, the substrate 1 is removed by wet or dry etching. For example, when the substrate 1 is a Si single crystal, immersion in an alkali aqueous solution can be performed as a wet etching method. The alkali aqueous solution is preferably a 10-50% aqueous solution of potassium hydroxide (KOH), sodium hydroxide (NaOH), an ammonia-based compound (TMAH, tetramethylammonium hydroxide), or the like. Only the substrate 1 is removed by immersing the structure including the substrate 1, the stacked thermoelectric thin film 10, the adhesive layer 11, and the protective material 13 in the aqueous solution. In this case, the periphery may be coated with a resin or the like in order to protect the stacked thermoelectric thin film 10. The etching rate of the substrate 1 is measured in advance, and only the substrate 1 is removed by etching under time management.

On the other hand, the dry etching method is preferably performed by using an ion beam etching apparatus or reactive ion etching apparatus provided with a secondary ion mass spectrometry and having the function that an etching end point can be detected. For example, when the substrate 1 is a Si single crystal substrate and the main material of the first high-purity layer 2 is SiGe, Ge is regarded as a detection atom, and the time when Ge is detected is regarded as the etching end point. Even when wet etching is used, the substrate 1 is under-etched to leave the substrate 1 in order to prevent over-etching and then the remaining substrate 1 is removed by dry etching, thereby permitting precise removal of the substrate 1. The wet etching tends to cause a high etching rate with little damage, but the dry etching tends to cause high precision of end point detection. A combination of wet etching and dry etching tends to enable the rapid work of removing the substrate with high precision.

A coarse grinding step may be provided as a pre-step of etching treatment. For example, the substrate 1 is subjected to vertical grinding by abrasive grinding, CMP grinding with colloidal silica, or diamond slurry grinding with a soft metal plate such as a tin surface plate or the like, and then the substrate 1 may be removed by etching treatment.

Next, the formation of the conductive terminals 12 is described. The structure including the stacked thermoelectric thin film 10, the adhesive layer 11, and the protective material 13 resulted by removing the substrate 1 is further surface-protected (not shown). The surface protection can be performed by bonding a plastic film material or the like. After the surface protection, the resultant structure including the stacked thermoelectric thin film 10, the adhesive layer 11, and the protective material 13 is cut into a desired size.

Next, resist is applied to the structure including the stacked thermoelectric thin film 10, the adhesive layer 11, and the protective material 13. The viscosity of the resist and the rotational speed of a spinner are adjusted so that the thickness is about 1 to 3 μm. Then, resist holes are formed in the resist in order to form the conductive terminals 12 at the ends of the material of the stacked thermoelectric thin film 10.

Next, a low-resistance metal such as Au/Ti, Pt, Cu, Al, or an alloy thereof is deposited as a material of the conductive terminals 12. The thickness of the metal deposited is generally about 100 to 500 nm. Then, the resist is removed with a solvent. Washing with the solvent may be further performed for avoiding the residue of the resist. When the formation of the conductive terminals 12 is completed, a sample piece is separated from a jig. As described above, the thermoelectric device 14 with the conductive terminals 12 is completed as shown in FIGS. 4 and 5.

EXAMPLES

Typical examples of the stacked thermoelectric thin film 10 and the thermoelectric device 14 according to the present invention are described with reference to examples and a comparative example.

Example 1

In Example 1, a sample exclusive for N-type thermoelectric evaluation was formed and evaluated, the sample having characteristics equivalent to those of the thermoelectric device 14 including the stacked thermoelectric thin film 10 according to the second embodiment and the carrier supply layer 5 being doped with Sb. First, the stacked thermoelectric thin film 10 was formed on the substrate 1.

A Si single crystal substrate was prepared as the substrate 1. The (100) plane of the substrate 1 was used as a deposition surface. The substrate 1 was washed at a high temperature with a concentrated liquid prepared by adding an alkali or acid to a hydrogen peroxide base and then washed with hydrofluoric acid.

The stacked thermoelectric thin film 10 was formed on the washed substrate 1. First, SiGe was deposited to form the first high-purity layer 2. The Si:Ge composition ratio was 80:20. The thickness of the SiGe layer was 10 nm.

Then, the composite carrier supply layer 3 was formed. First, a Si-undoped layer was deposited as the second high-purity layer 4, and the thickness thereof was 4 nm. Then, a SiGeSb film was deposited to 2 nm thereon to serve as the carrier supply layer 5. A Si-undoped layer was deposited to 4 nm thereon to serve as the third high-purity layer 6. The Si:Ge composition ratio of the SiGeSb layer serving as the carrier supply layer 5 was 80:20. In this case, Sb was added at the same time as deposition. The amount of Sb added was 0.001 atomic %. This amount by atomic % is based on SiGe.

The first high-purity layer 2 and the composite carrier supply layer 3 were deposited repeatedly 10 times, thereby forming the stacked thermoelectric thin film 10 including multiple layers formed by stacking 10 times the first high-purity layer 2 and the composite carrier supply layer 3.

Example 2

In Example 1, the SiGeSb film formed by adding Sb to a SiGe film was deposited as the carrier supply layer 5. However, in Example 2, a SiGeB film was formed by substituting Sb with B, and a sample exclusive for P-type thermoelectric evaluation was formed and evaluated. With the exception of the additive, Example 2 was the same as Example 1.

Comparative Example

A stacked thermoelectric thin film was formed as a comparative example having a configuration in which the composite carrier supply layer 3 of Examples 1 and 2 was changed to a Si film. Specifically, a SiGe film was deposited to 10 nm on a Si substrate washed, and a Si film was deposited to 10 nm thereon. The two-layer film including the SiGe film and the Si film was deposited 10 times to form a stacked thermoelectric thin film.

(Formation of Sample for Evaluation)

A sample was formed for evaluating the stacked thermoelectric thin film of each of the examples and the comparative example.

Figure 6:
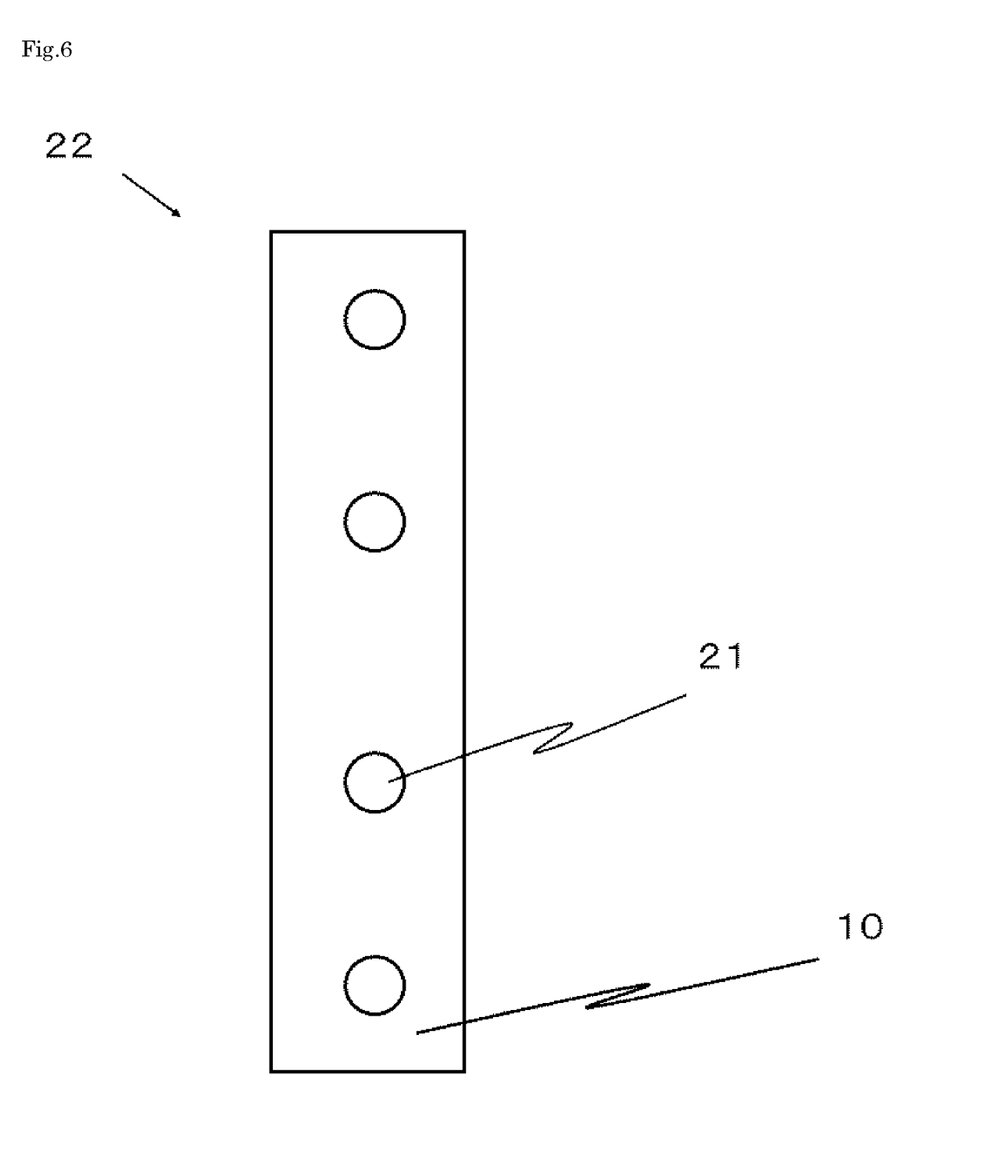
FIG. 6 is a top view schematically showing a sample for evaluation of examples and a comparative example.
Figure 7:
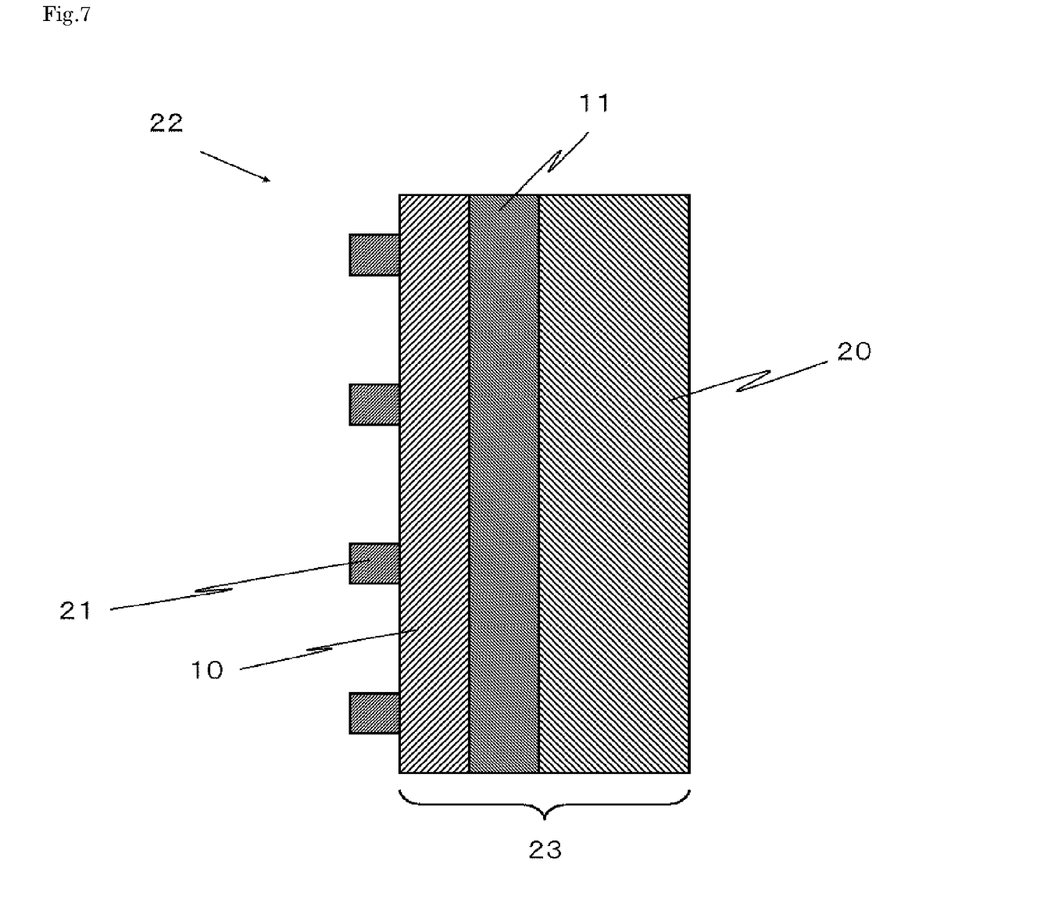
FIG. 7 is a cross-sectional view schematically showing a sample for evaluation of examples and a comparative example.

FIG. 6 is a top view of a strip-shaped sample 22 for evaluation of the examples and the comparative examples, and FIG. 7 is a cross-sectional view of the sample 22. A method for forming the sample 22 for evaluation is described below.

An adhesive layer 11 including an adhesive resin film was applied to the stacked thermoelectric thin film 10 deposited on the Si substrate by a spin coating method. Then, an alumina substrate 20 having the same size as the single-crystal Si substrate was bonded as a protective material through the adhesive layer 11. Then, the adhesive resin film was cured by a heat curing method under pressure to form a stack 23.

Next, the Si single-crystal substrate was removed, and the stack 23 including the stacked thermoelectric thin film 10, the adhesive layer 11, and the alumina substrate 20 was cut. The resultant stack 23 was cut by using a dicer having an edge thickness of 60 μm. The cut stack 23 was a strip-shaped sample of 20 mm in length and 4 mm in width.

Next, as shown in FIG. 6, platinum electrodes 21 having a diameter of 1 mm and a thickness of 100 nm were formed on the strip-shaped sample 22 for evaluation.

(Measurement of Seebeck Coefficient)

Figure 8:
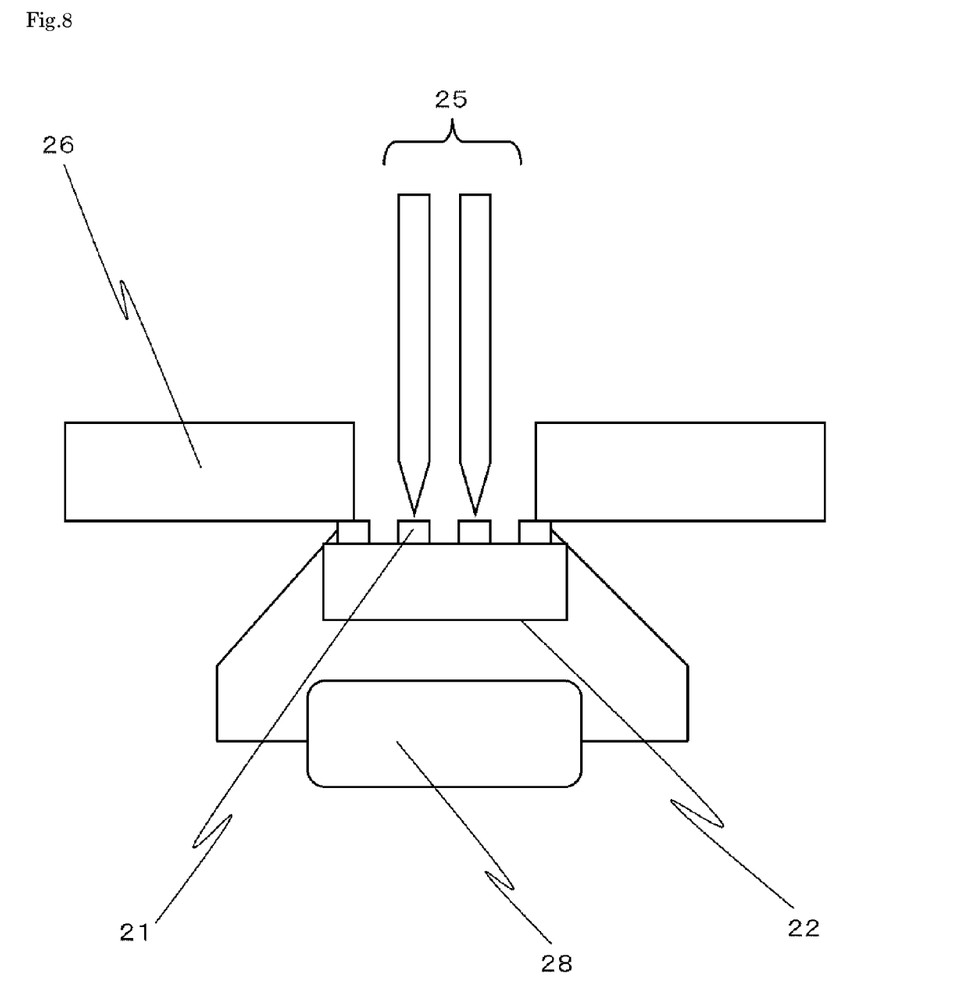
FIG. 8 is an explanatory view of an apparatus used for Seebeck measurement.

The Seebeck coefficient of the completed sample 22 for evaluation was measured. FIG. 8 is a drawing illustrating a configuration of an apparatus for Seebeck measurement. A measurement method is schematically shown in FIG. 8. The measurement was performed in a constant-temperature oven heated and kept at 50° C. Electric conductivity of the sample 22 for evaluation was measured by passing, from a constant-current source 28, a constant current (0.15 mA) between the two outer platinum electrodes 21 formed on the surface of the sample 22 for evaluation, placing thermocouple probes 25 between the two inner platinum electrodes 21 of the sample 22 for evaluation, and measuring voltage dV between the thermocouple probes 25. The Seebeck coefficient was measured by placing a block heater 26 in contact with each of the two outer platinum electrodes 21 formed on the surface of the sample 22 for evaluation to provide a temperature gradient of 5 degrees/8 mm in the longitudinal direction of the sample 22 for evaluation, placing the thermocouple probes 25 between the two inner electrodes 21 of the sample 22 for evaluation, and measuring thermoelectromotive force dE.

Table 1 shows the values of rocking-curve half widths of the 0th peak and satellite peaks observed in X-ray diffraction measurement of the stacked thermoelectric thin films of the examples and the comparative example. Table 1 also shows the results of calculation of the values of power factor $S^2\sigma$ from the Seebeck coefficient S and electric conductivity $\sigma$ measured for the samples for evaluation of the examples and the comparative example.

TABLE 1

|  |  |  | Satellite peak | | | Power |
| --- | --- | --- | --- | --- | --- | --- |
|  |  | 0th order | First order | Second order | Third order | factor (μW/mK$^2$) |
| Example 1 | 2θ(deg) | 69.0 | 68.6 | 68.1 | 67.6 | 482 |
|  | Rocking-curve half width (deg) | 0.0075 | 0.0157 | 0.0159 | 0.0171 |  |
| Example 2 | 2θ(deg) | 69.0 | 68.5 | 68.0 | 67.5 | 521 |
|  | Rocking-curve half width (deg) | 0.0075 | 0.0263 | 0.0215 | 0.0214 |  |
| Comparative Example | 2θ(deg) | 69.0 | 68.7 | 68.1 | 67.6 | 210 |
|  | Rocking-curve half width (deg) | 0.0077 | 0.0278 | 0.0225 | 0.0226 |  |

The results shown in Table 1 indicate that the rocking-curve half widths of the 0th peaks in X-ray diffraction measurement of the stacked thermoelectric thin films of Examples 1 and 2 are both 0.0075 deg, the rocking-curve half width of the 0th peak in X-ray diffraction measurement of the stacked thermoelectric thin film of Comparative Example is 0.0077 deg, and these examples have substantially the same crystallinity. Similarly, with respect to the rocking-curve half widths of the satellite peaks, the rocking-curve half widths of the first-order, second-order, and third-order satellite peaks of Example 1 are 0.0157 deg, 0.0159 deg, and 0.0171 deg, respectively, the rocking-curve half widths of the first-order, second-order, and third-order satellite peaks of Example 2 are 0.0263 deg, 0.0215 deg, and 0.0214 deg, respectively, and the rocking-curve half widths of the first-order, second-order, and third-order satellite peaks of Comparative Example are 0.0278 deg, 0.0225 deg, and 0.0226 deg, respectively. It is thus found that Examples 1 and 2 and Comparative Example have substantially the same crystallinity.

On the other hand, the value of power factor $S^2\sigma$ of Example 1 is 482 ($\mu W/mK^2$), and the value of power factor $S^2\sigma$ of Example 2 is 521 ($\mu W/mK^2$), while the value of power factor $S^2\sigma$ of Comparative Example is 210 ($\mu W/mK^2$). Thus, it is found that a higher value of power factor can be realized by the configuration of the present invention.

Example 3

In Example 3, as shown in Table 2, the carrier supply layer 5 including a SiGeSb film formed by adding Sb to a SiGe film had a thickness of 0.5 nm corresponding to the thickness of a monoatomic layer, and the thickness of each of the first high-purity layer 2, the second high-purity layer 4, and the third high-purity layer 6 was changed from 0.8 nm to 55 nm. The value of power factor $S^2\sigma$ in each of the stacked film configurations was confirmed. With the exception of the thicknesses, Example 3 was the same as Example 1. The contents shown in Table 2 reveal that when the thickness of each of the first high-purity layer 2, the second high-purity layer 4, and the third high-purity layer 6 is 1 nm or more and 50 nm or less, a particularly high value of power factor can be achieved.

TABLE 2

| | First high-purity layer SiGe thickness (nm) | Second high-purity layer Si thickness (nm) | Carrier supply layer SiGeSb thickness (nm) | Third high-purity layer Si thickness (nm) | Power factor ($\mu W/mK^2$) |
|---|---|---|---|---|---|
| Example 3 | 0.8 | 0.8 | Monoatomic layer 0.5 | 0.8 | 343 |
| | 0.9 | 0.9 | Monoatomic layer 0.5 | 0.9 | 347 |
| | 1 | 1 | Monoatomic layer 0.5 | 1 | 465 |
| | 5 | 5 | Monoatomic layer 0.5 | 5 | 479 |
| | 10 | 10 | Monoatomic layer 0.5 | 10 | 476 |
| | 20 | 20 | Monoatomic layer 0.5 | 20 | 462 |
| | 30 | 30 | Monoatomic layer 0.5 | 30 | 446 |
| | 40 | 40 | Monoatomic layer 0.5 | 40 | 422 |
| | 45 | 45 | Monoatomic layer 0.5 | 45 | 389 |
| | 50 | 50 | Monoatomic layer 0.5 | 50 | 355 |
| | 52 | 52 | Monoatomic layer 0.5 | 52 | 322 |
| | 55 | 55 | Monoatomic layer 0.5 | 55 | 315 |

Example 4

In Example 4, as shown in Table 3, the carrier supply layer 5 including a SiGeSb film formed by adding Sb to a SiGe film had a thickness of 10 nm, and the thickness of each of the first high-purity layer 2, the second high-purity layer 4, and the third high-purity layer 6 was changed from 0.8 nm to 55 nm. The value of power factor $S^2\sigma$ in each of the stacked film configurations was confirmed. With the exception of the thicknesses, Example 4 was the same as Example 1. The contents shown in Table 3 reveal that when the thickness of each of the first high-purity layer 2, the second high-purity layer 4, and the third high-purity layer 6 is 1 nm or more and 50 nm or less, a particularly high value of power factor can be achieved.

TABLE 3

| | First high-purity layer SiGe thickness (nm) | Second high-purity layer Si thickness (nm) | Carrier supply layer SiGeSb thickness (nm) | Third high-purity layer Si thickness (nm) | Power factor ($\mu W/mK^2$) |
|---|---|---|---|---|---|
| Example 4 | 0.8 | 0.8 | 10 | 0.8 | 342 |
| | 0.9 | 0.9 | 10 | 0.9 | 345 |
| | 1 | 1 | 10 | 1 | 362 |
| | 5 | 5 | 10 | 5 | 477 |
| | 10 | 10 | 10 | 10 | 473 |
| | 20 | 20 | 10 | 20 | 461 |
| | 30 | 30 | 10 | 30 | 442 |
| | 40 | 40 | 10 | 40 | 414 |
| | 45 | 45 | 10 | 45 | 388 |
| | 50 | 50 | 10 | 50 | 353 |
| | 52 | 52 | 10 | 52 | 319 |
| | 55 | 55 | 10 | 55 | 314 |

Example 5

In Example 5, as shown in Table 4, the carrier supply layer 5 including a SiGeB film formed by adding B to a SiGe film had a thickness of 0.5 nm corresponding to the thickness of a monoatomic layer, and the thickness of each of the first high-purity layer 2, the second high-purity layer 4, and the third high-purity layer 6 was changed from 0.8 nm to 55 nm. The value of power factor $S^2\sigma$ in each of the stacked film configurations was confirmed. With the exception of the thicknesses, Example 5 was the same as Example 2. The contents shown in Table 4 reveal that when the thickness of each of the first high-purity layer 2, the second high-purity layer 4, and the third high-purity layer 6 is 1 nm or more and 50 nm or less, a particularly high value of power factor can be achieved.

TABLE 4

| | First high-purity layer SiGe thickness (nm) | Second high-purity layer Si thickness (nm) | Carrier supply layer SiGeB thickness (nm) | Third high-purity layer Si thickness (nm) | Power factor ($\mu W/mK^2$) |
|---|---|---|---|---|---|
| Example 5 | 0.8 | 0.8 | Monoatomic layer 0.5 | 0.8 | 346 |
| | 0.9 | 0.9 | Monoatomic layer 0.5 | 0.9 | 349 |
| | 1 | 1 | Monoatomic layer 0.5 | 1 | 471 |
| | 5 | 5 | Monoatomic layer 0.5 | 5 | 481 |
| | 10 | 10 | Monoatomic layer 0.5 | 10 | 479 |
| | 20 | 20 | Monoatomic layer 0.5 | 20 | 466 |
| | 30 | 30 | Monoatomic layer 0.5 | 30 | 447 |
| | 40 | 40 | Monoatomic layer 0.5 | 40 | 419 |
| | 45 | 45 | Monoatomic layer 0.5 | 45 | 392 |
| | 50 | 50 | Monoatomic layer 0.5 | 50 | 361 |
| | 52 | 52 | Monoatomic layer 0.5 | 52 | 331 |

TABLE 4-continued

| First high-purity layer SiGe thickness (nm) | Second high-purity layer Si thickness (nm) | Carrier supply layer SiGeSb thickness (nm) | Third high-purity layer Si thickness (nm) | Power factor (μW/mK²) |
|---|---|---|---|---|
| 55 | 55 | Monoatomic layer 0.5 | 55 | 319 |

Example 6

In Example 6, as shown in Table 5, the carrier supply layer 5 including a SiGeB film formed by adding B to a SiGe film had a thickness of 10 nm, and the thickness of each of the first high-purity layer 2, the second high-purity layer 4, and the third high-purity layer 6 was changed from 0.8 nm to 55 nm. The value of power factor $S^2\sigma$ in each of the stacked film configurations was confirmed. With the exception of the thicknesses, Example 6 was the same as Example 2. The contents shown in Table 5 reveal that when the thickness of each of the first high-purity layer 2, the second high-purity layer 4, and the third high-purity layer 6 is 1 nm or more and 50 nm or less, a particularly high value of power factor can be achieved.

TABLE 5

| | First high-purity layer SiGe thickness (nm) | Second high-purity layer Si thickness (nm) | Carrier supply layer SiGeSb thickness (nm) | Third high-purity layer Si thickness (nm) | Power factor (μW/mK²) |
|---|---|---|---|---|---|
| Example 6 | 0.8 | 0.8 | 10 | 0.8 | 344 |
| | 0.9 | 0.9 | 10 | 0.9 | 348 |
| | 1 | 1 | 10 | 1 | 469 |
| | 5 | 5 | 10 | 5 | 479 |
| | 10 | 10 | 10 | 10 | 477 |
| | 20 | 20 | 10 | 20 | 464 |
| | 30 | 30 | 10 | 30 | 447 |
| | 40 | 40 | 10 | 40 | 417 |
| | 45 | 45 | 10 | 45 | 390 |
| | 50 | 50 | 10 | 50 | 359 |
| | 52 | 52 | 10 | 52 | 328 |
| | 55 | 55 | 10 | 55 | 318 |

The contents shown in Tables 2, 3, 4, and 5 reveal that when the thickness of each of the first high-purity layer 2, the second high-purity layer 4, and the third high-purity layer 6 is 1 nm or more and 50 nm or less, a particularly high value of power factor can be achieved.

Example 7

In Example 7, as shown in Table 6, the thickness of each of the first high-purity layer 2, the second high-purity layer 4, and the third high-purity layer 6 was 1 nm, and the thickness of the carrier supply layer 5 including a SiGeSb film formed by adding Sb to a SiGe film was changed from 0.5 nm corresponding to the thickness of a monoatomic layer to 20 nm. The value of power factor $S^2\sigma$ in each of the stacked film configurations was confirmed. With the exception of the thicknesses, Example 7 was the same as Example 1. The contents shown in Table 6 reveal that when the thickness of the carrier supply layer 5 is equal to or larger than the thickness of a monoatomic layer and 10 nm or less, a particularly high value of power factor can be achieved.

TABLE 6

| | First high-purity layer SiGe thickness (nm) | Second high-purity layer Si thickness (nm) | Carrier supply layer SiGeSb thickness (nm) | Third high-purity layer Si thickness (nm) | Power factor (μW/mK²) |
|---|---|---|---|---|---|
| Example 7 | 1 | 1 | Monoatomic layer 0.5 | 1 | 465 |
| | 1 | 1 | 0.7 | 1 | 467 |
| | 1 | 1 | 0.9 | 1 | 473 |
| | 1 | 1 | 1 | 1 | 475 |
| | 1 | 1 | 3 | 1 | 473 |
| | 1 | 1 | 5 | 1 | 471 |
| | 1 | 1 | 7 | 1 | 469 |
| | 1 | 1 | 9 | 1 | 465 |
| | 1 | 1 | 10 | 1 | 462 |
| | 1 | 1 | 11 | 1 | 452 |
| | 1 | 1 | 15 | 1 | 446 |
| | 1 | 1 | 20 | 1 | 440 |

Example 8

In Example 8, as shown in Table 7, the thickness of each of the first high-purity layer 2, the second high-purity layer 4, and the third high-purity layer 6 was 50 nm, and the thickness of the carrier supply layer 5 including a SiGeSb film formed by adding Sb to a SiGe film was changed from 0.5 nm corresponding to the thickness of a monoatomic layer to 20 nm. The value of power factor $S^2\sigma$ in each of the stacked film configurations was confirmed. With the exception of the thicknesses, Example 8 was the same as Example 1. The contents shown in Table 7 reveal that when the thickness of the carrier supply layer 5 is equal to or larger than the thickness of a monoatomic layer and 10 nm or less, a particularly high value of power factor can be achieved.

TABLE 7

| | First high-purity layer SiGe thickness (nm) | Second high-purity layer Si thickness (nm) | Carrier supply layer SiGeSb thickness (nm) | Third high-purity layer Si thickness (nm) | Power factor (μW/mK²) |
|---|---|---|---|---|---|
| Example 8 | 50 | 50 | Monoatomic layer 0.5 | 50 | 355 |
| | 50 | 50 | 0.7 | 50 | 357 |
| | 50 | 50 | 0.9 | 50 | 363 |
| | 50 | 50 | 1 | 50 | 365 |
| | 50 | 50 | 3 | 50 | 364 |
| | 50 | 50 | 5 | 50 | 363 |
| | 50 | 50 | 7 | 50 | 359 |
| | 50 | 50 | 9 | 50 | 356 |
| | 50 | 50 | 10 | 50 | 353 |
| | 50 | 50 | 11 | 50 | 345 |
| | 50 | 50 | 15 | 50 | 340 |
| | 50 | 50 | 20 | 50 | 335 |

Example 9

In Example 9, as shown in Table 8, the thickness of each of the first high-purity layer 2, the second high-purity layer 4, and the third high-purity layer 6 was 1 nm, and the thickness of the carrier supply layer 5 including a SiGeB film formed by adding B to a SiGe film was changed from 0.5 nm corresponding to the thickness of a monoatomic layer to 20 nm. The value of power factor $S^2\sigma$ in each of the stacked film configurations was confirmed. With the exception of the thicknesses, Example 9 was the same as Example 2. The contents shown in Table 8 reveal that when the thickness of the carrier supply layer 5 is equal to or larger than the thickness of a monoatomic layer and 10 nm or less, a particularly high value of power factor can be achieved.

TABLE 8

| First high-purity layer SiGe thickness (nm) | Second high-purity layer Si thickness (nm) | Carrier supply layer SiGeSb thickness (nm) | Third high-purity layer Si thickness (nm) | Power factor ($\mu W/mK^2$) |
|---|---|---|---|---|
| Example 9 | | | | |
| 1 | 1 | Monoatomic layer 0.5 | 1 | 471 |
| 1 | 1 | 0.7 | 1 | 473 |
| 1 | 1 | 0.9 | 1 | 478 |
| 1 | 1 | 1 | 1 | 481 |
| 1 | 1 | 3 | 1 | 479 |
| 1 | 1 | 5 | 1 | 477 |
| 1 | 1 | 7 | 1 | 475 |
| 1 | 1 | 9 | 1 | 472 |
| 1 | 1 | 10 | 1 | 469 |
| 1 | 1 | 11 | 1 | 460 |
| 1 | 1 | 15 | 1 | 455 |
| 1 | 1 | 20 | 1 | 449 |

Example 10

In Example 10, as shown in Table 9, the thickness of each of the first high-purity layer 2, the second high-purity layer 4, and the third high-purity layer 6 was 50 nm, and the thickness of the carrier supply layer 5 including a SiGeB film formed by adding B to a SiGe film was changed from 0.5 nm corresponding to the thickness of a monoatomic layer to 20 nm. The value of power factor $S^2\sigma$ in each of the stacked film configurations was confirmed. With the exception of the thicknesses, Example 10 was the same as Example 2. The contents shown in Table 9 reveal that when the thickness of the carrier supply layer 5 is equal to or larger than the thickness of a monoatomic layer and 10 nm or less, a particularly high value of power factor can be achieved.

TABLE 9

| First high-purity layer SiGe thickness (nm) | Second high-purity layer Si thickness (nm) | Carrier supply layer SiGeSb thickness (nm) | Third high-purity layer Si thickness (nm) | Power factor ($\mu W/mK^2$) |
|---|---|---|---|---|
| Example 10 | | | | |
| 50 | 50 | Monoatomic layer 0.5 | 50 | 361 |
| 50 | 50 | 0.7 | 50 | 363 |
| 50 | 50 | 0.9 | 50 | 370 |
| 50 | 50 | 1 | 50 | 372 |
| 50 | 50 | 3 | 50 | 370 |
| 50 | 50 | 5 | 50 | 367 |
| 50 | 50 | 7 | 50 | 365 |
| 50 | 50 | 9 | 50 | 362 |
| 50 | 50 | 10 | 50 | 359 |
| 50 | 50 | 11 | 50 | 350 |
| 50 | 50 | 15 | 50 | 346 |
| 50 | 50 | 20 | 50 | 342 |

The contents shown in Tables 6, 7, 8, and 9 reveal that when the thickness of the carrier supply layer 5 is equal to or larger than the thickness of ae monoatomic layer and 10 nm or less, a particularly high value of power factor can be achieved.

Example 11

Next, the deposition temperature in the same stacked configuration as in Example 1 was changed to change crystallinity, thereby forming samples of a stacked thermoelectric thin film, and the value of power factor $S^2\sigma$ in of each of the samples was confirmed. Table 10 shows the deposition temperature, the rocking-curve half width of the 0th peak in X-ray diffraction, and the value of powder factor of each of the samples. With the deposition temperature of 600° C., good crystallinity is obtained due to the value of rocking-curve half width of 0.0075 deg, and the value of power factor is 482 ($\mu W/mK^2$), thereby exhibiting good characteristics. With the deposition temperature of 500° C., the value of rocking-curve half width is 0.0155 deg, and the value of power factor is 475 ($\mu W/mK^2$), while with the deposition temperature of 400° C., the value of rocking-curve half width is 0.0540 deg, and the value of power factor is 422 ($\mu W/mK^2$). With the deposition temperature of 300° C., the value of rocking-curve half width is 0.0998 deg, and the value of power factor is 355 ($\mu W/mK^2$). Therefore, the value of power factor decreases as the rocking-curve half width increases. With the deposition temperature of 250° C., the value of rocking-curve half width is 0.120 deg, and the value of power factor is significantly decreased to 266 ($\mu W/mK^2$). Thus, it is found that when the rocking-curve half width of the 0th peak in X-ray diffraction of the stacked thermoelectric thin film is 0.1 deg or less, high power factor $S^2\sigma$ can be achieved.

TABLE 10

| Rocking-curve half width (deg) | Deposition temperature (° C.) | Power factor ($\mu W/mK^2$) |
|---|---|---|
| 0.0075 | 600 | 482 |
| 0.0155 | 500 | 475 |
| 0.0540 | 400 | 422 |
| 0.0998 | 300 | 355 |
| 0.1200 | 250 | 266 |

What is claimed is:

1. Thermoelectric device comprising:
   a semiconductor stacked thermoelectric thin film including a first high-purity layer composed of SiGe as a main material and a composite carrier supply layer formed on the first high-purity layer,
   wherein the composite carrier supply layer includes a second high-purity layer and third high-purity layer composed of Si as a main material, and a carrier supply layer held between the second and third high-purity layers and composed of SiGe as a main material; and
   the carrier supply layer is a P-type carrier supply layer to which an additive of a group XIII element is added or a N-type carrier supply layer to which an additive of a group XV element is added, wherein the semiconductor stacked thermoelectric thin film has a plurality of stacked structures each having the first high-purity layer and the composite carrier supply layer.

2. The thermoelectric device according to claim 1, wherein at least one of the rocking-curve half widths of a 0th-order peak corresponding to the average lattice constant of a superlattice of the stacked thermoelectric thin film and satellite peaks of the 0th-order peak observed by X-ray diffraction measurement is 0.1° or less.

3. The thermoelectric device according to claim 1, wherein third or higher-order satellite peaks of a superlattice of the stacked thermoelectric thin film are observed in X-ray diffraction measurement of the stacked thermoelectric thin film.

4. The thermoelectric device according to claim 1, wherein the thickness of each of the first, second, and third high-purity layers is 1 nm or more and 50 nm or less.

5. The thermoelectric device according to claim 1, wherein the thickness of the carrier supply layer is equal to or larger than the thickness of a monoatomic layer and 10 nm or less.

* * * * *